United States Patent
Chang et al.

(10) Patent No.: US 11,474,183 B1
(45) Date of Patent: Oct. 18, 2022

(54) MOTION CORRECTION SYSTEMS AND METHODS OF PROPELLER MAGNETIC RESONANCE IMAGES

(71) Applicant: GE PRECISION HEALTHCARE LLC, Wauwatosa, WI (US)

(72) Inventors: Shaorong Chang, McKinney, TX (US); Xucheng Zhu, Mountain View, CA (US); Ali Ersoz, Wauwatosa, WI (US); Ajeetkumar Gaddipati, Waukesha, WI (US); Moran Wei, Pewaukee, WI (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 0 days.

(21) Appl. No.: 17/370,627

(22) Filed: Jul. 8, 2021

(51) Int. Cl.
 *G01V 3/00* (2006.01)
 *G01R 33/565* (2006.01)
 *G01R 33/561* (2006.01)
 *G01R 33/48* (2006.01)

(52) U.S. Cl.
 CPC ... *G01R 33/56509* (2013.01); *G01R 33/4826* (2013.01); *G01R 33/5611* (2013.01)

(58) Field of Classification Search
 CPC .............. G01R 33/543; G01R 33/5659; G01R 33/3415; G01R 33/36; A61B 5/055
 USPC .......................................................... 324/309
 See application file for complete search history.

(56) References Cited

U.S. PATENT DOCUMENTS

| | | | | |
|---|---|---|---|---|
| 7,382,127 | B2 * | 6/2008 | Gaddipati | G01R 33/5611 324/309 |
| 7,535,222 | B2 | 5/2009 | Bammer et al. | |
| 2011/0298793 | A1 * | 12/2011 | Lauritsch | A61B 6/4458 345/419 |

OTHER PUBLICATIONS

J. G. Pipe, V. G. Farthing, and K P. Forbes, "Multishot Diffusion—Weighted FSE Using PROPELLER MRI", Magnetic Resonance in Medicine 47: 42-52 (2002).
J. G. Pipe, "Motion Correction with PROPELLER MRI: Application to Head Motion and Free-Breathing Cardiac Imaging", Magnetic Resonance in Medicine 42: 963-969 (1999).

* cited by examiner

*Primary Examiner* — Walter L Lindsay, Jr.
*Assistant Examiner* — Frederick Wenderoth
(74) *Attorney, Agent, or Firm* — Armstrong Teasdale LLP

(57) ABSTRACT

A magnetic resonance (MR) imaging method of correcting motion in precorrection MR images of a subject is provided. The method includes applying, by an MR system, a pulse sequence having a k-space trajectory of a blade being rotated in k-space. The method also includes acquiring k-space data of a three-dimensional (3D) imaging volume of the subject, the k-space data of the 3D imaging volume corresponding to the precorrection MR images and acquired by the pulse sequence. The method further includes receiving a 3D MR calibration data of a 3D calibration volume, wherein the 3D calibration volume is greater than or equal to the 3D imaging volume, jointly estimating rotation and translation in the precorrection MR images based on the k-space data of the 3D imaging volume and the calibration data, correcting motion in the precorrection images based on the estimated rotation and the estimated translation, and outputting the motion-corrected images.

20 Claims, 13 Drawing Sheets

US 11,474,183 B1

MOTION CORRECTION SYSTEMS AND METHODS OF PROPELLER MAGNETIC RESONANCE IMAGES

BACKGROUND

The field of the disclosure relates generally to systems and methods of motion correction, and more particularly, to systems and methods of motion correction of magnetic resonance (MR) images acquired by PROPELLER (Periodically Rotated Overlapping ParallEL Lines with Enhanced Reconstruction).

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Although compared to Cartesian sampling PROPELLER sampling scheme is relatively insensitive to motion, motion correction is needed for PROPELLER sampling to reduce artifacts introduced by motion. Known motion correction is disadvantaged in some aspects and improvements are desired.

BRIEF DESCRIPTION

In one aspect, a magnetic resonance (MR) imaging method of correcting motion in precorrection MR images of a subject is provided. The method includes applying, by an MR system, a pulse sequence having a k-space trajectory of a blade being rotated in k-space, the blade including a plurality of views. The method also includes acquiring k-space data of a three-dimensional (3D) imaging volume of the subject, the k-space data of the 3D imaging volume corresponding to the precorrection MR images and acquired by the pulse sequence. The method further includes receiving a 3D MR calibration data of a 3D calibration volume, wherein the 3D calibration volume is greater than or equal to the 3D imaging volume, jointly estimating rotation and translation in the precorrection MR images based on the k-space data of the 3D imaging volume and the calibration data, correcting motion in the precorrection images based on the estimated rotation and the estimated translation, and outputting the motion-corrected images.

In another aspect, a motion correction system of correcting motion in precorrection MR images of a subject is provided. The system includes a motion correction computing device, the motion correction computing device comprising at least one processor in communication with at least one memory device. The at least one processor is programmed to receive k-space data of a 3D imaging volume of the subject, the k-space data of the 3D imaging volume corresponding to the precorrection MR images and acquired by a pulse sequence having a k-space trajectory of a blade being rotated in k-space, the blade including a plurality of views. The at least one processor is also programmed to receive a 3D MR calibration data of a 3D calibration volume, wherein the 3D calibration volume is greater than or equal to the 3D imaging volume. The at least one processor is further programmed to jointly estimate rotation and translation in the precorrection MR images based on the k-space data of the 3D imaging volume and the calibration data, correct motion in the precorrection images based on the estimated rotation and the estimated translation, and output the motion-corrected images.

DRAWINGS

Figure 4A:
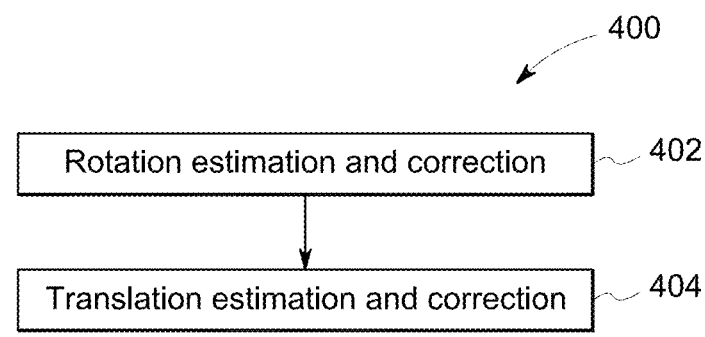
FIG. 4A is a flow chart of a known motion correction method of images acquired by PROPELLER.
Figure 4B:
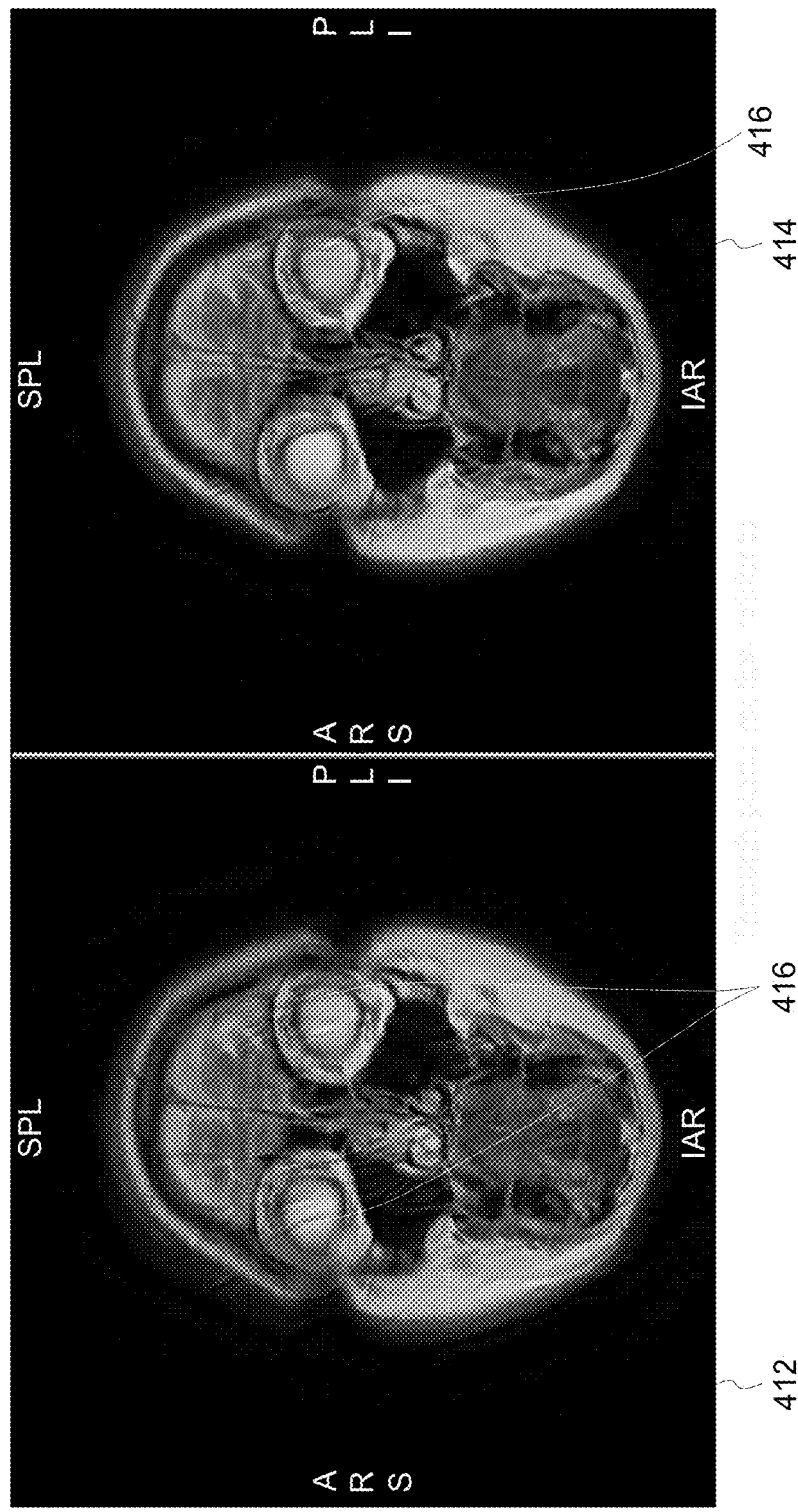

FIG. 4B a comparison of an image without motion correction and an image with the known motion correction shown in FIG. 4A.

Figure 4C:
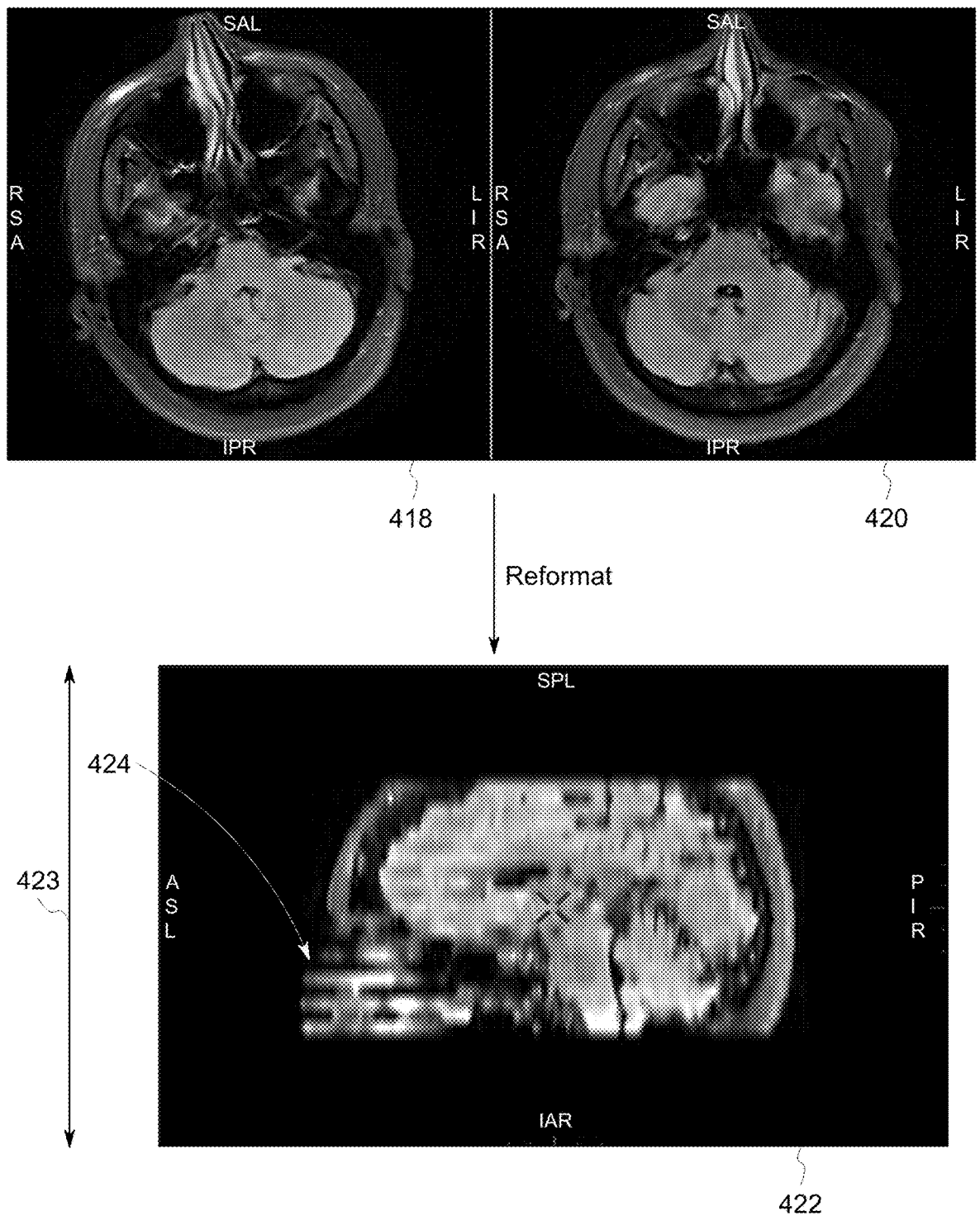

FIG. 4C shows images of neighboring slices with the known motion correction shown in FIG. 4A.

Figure 4D:
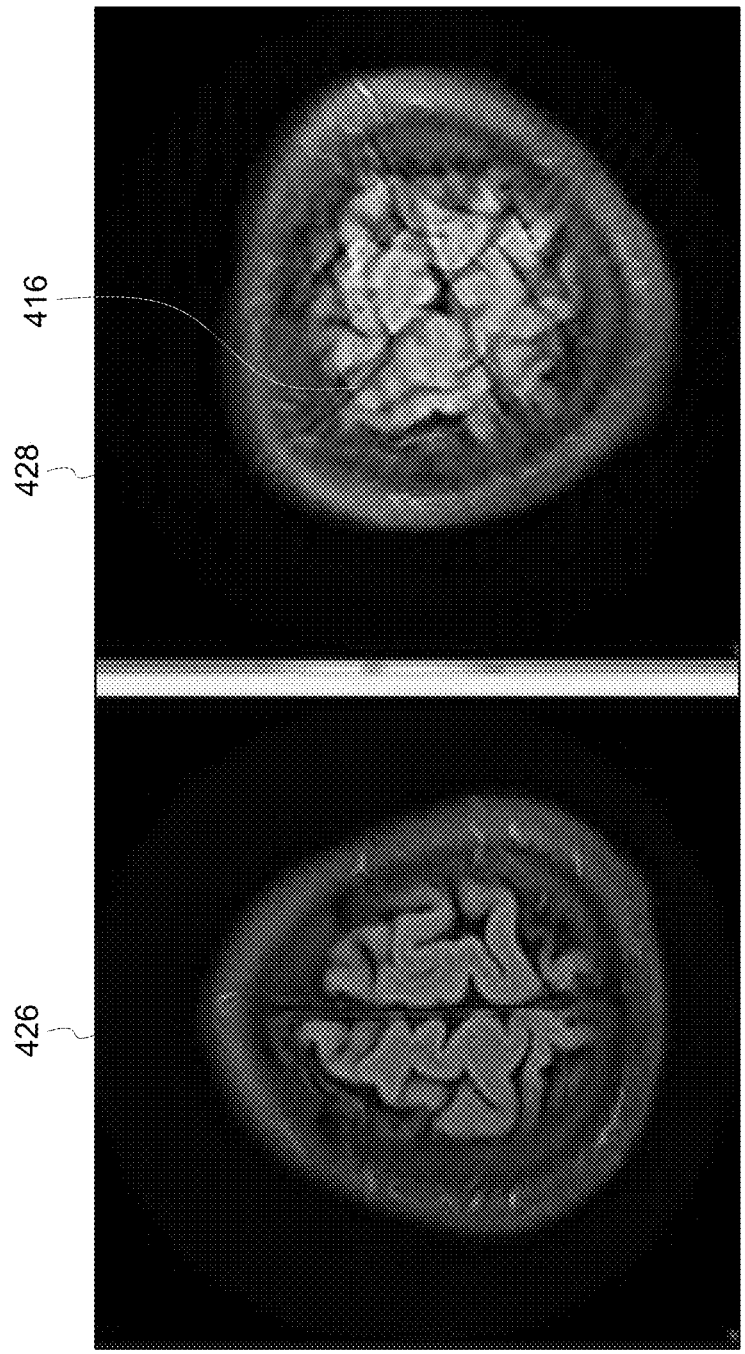

FIG. 4D is comparison of an image of an edge slice without motion correction and an image of the edge slice with the known motion correction shown in FIG. 4A.

Figure 5A:
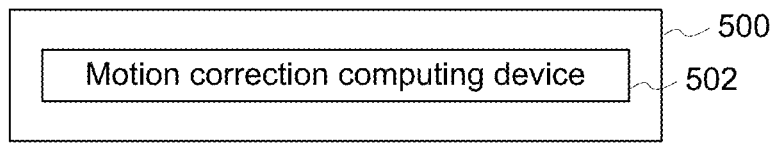

FIG. 5A is schematic diagram of an exemplary motion correction system.

Figure 5B:
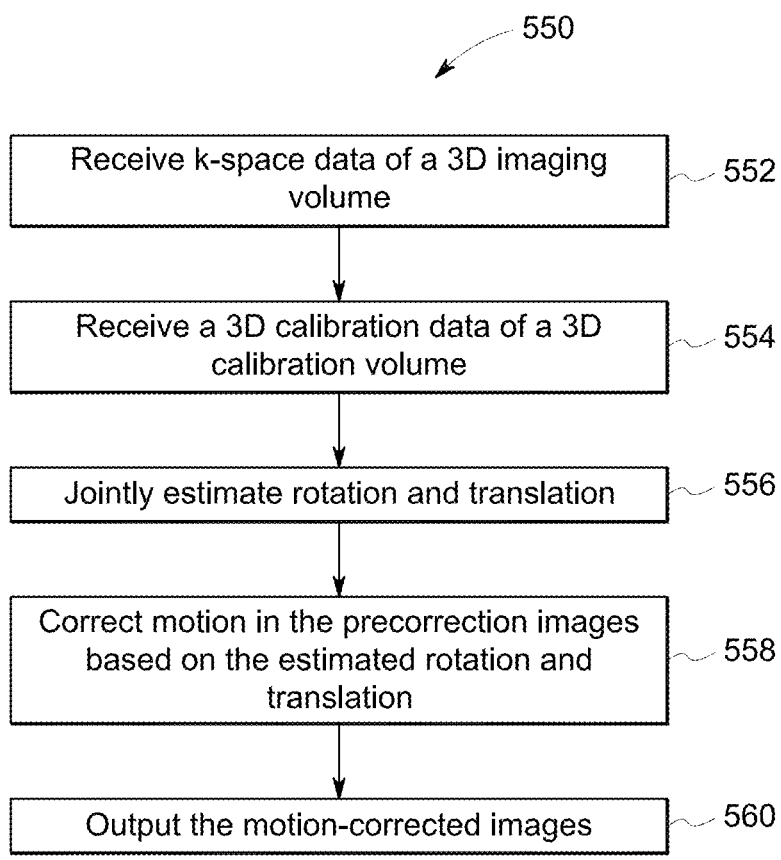

FIG. 5B is a flow chart of an exemplary method of motion correction.

Figure 6:
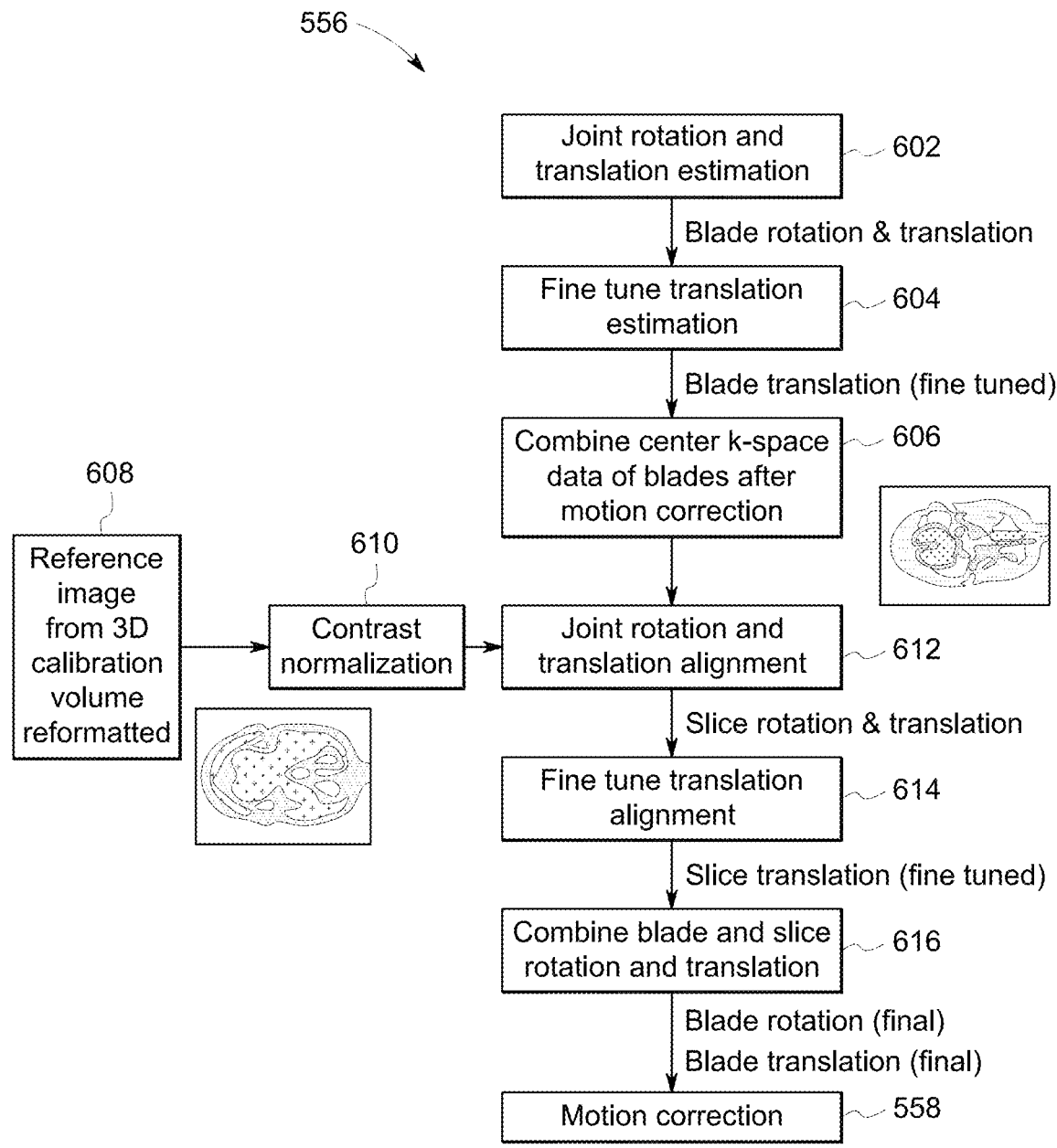

FIG. 6 is a flow chart of an exemplary method of jointly estimating rotation and translation.

Figure 7:
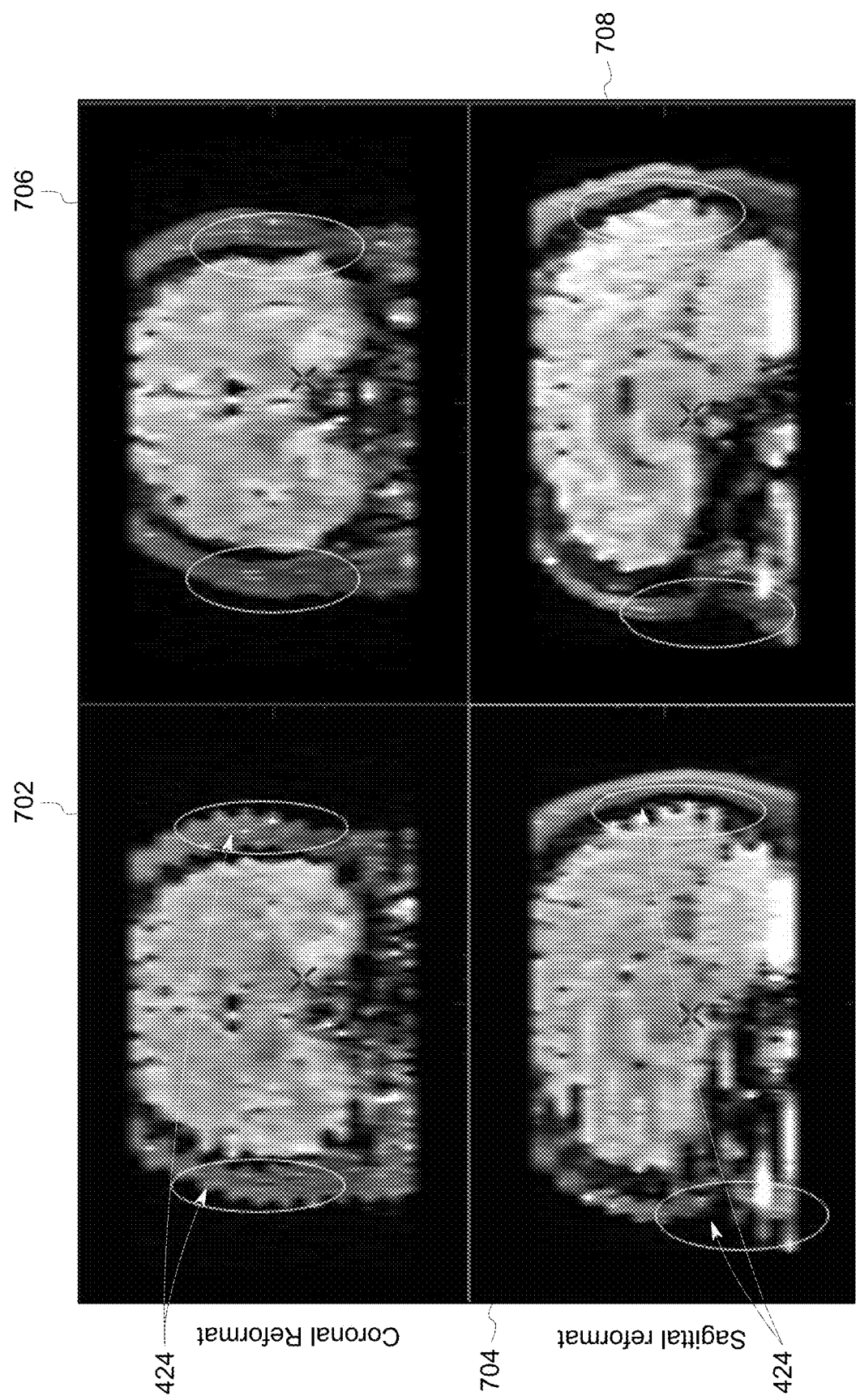

FIG. 7 is a comparison of images motion-corrected by the known method shown in FIG. 4A and images motioned-corrected by the systems and methods shown in FIGS. 5A-6.

Figure 8:
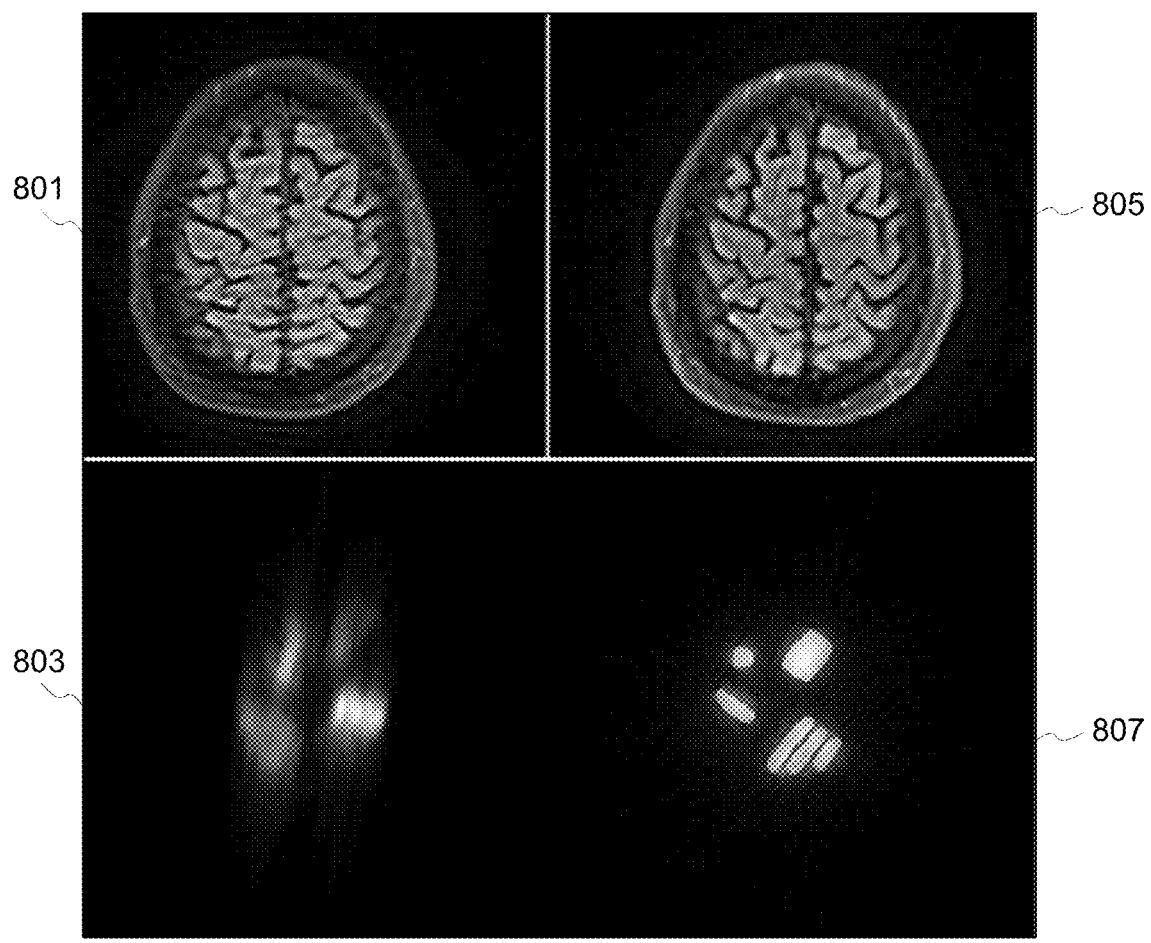

FIG. 8 is another comparison of images motion-corrected by the known method shown in FIG. 4A and with images motioned-corrected by the systems and methods shown in FIGS. 5A-6.

Figure 9:
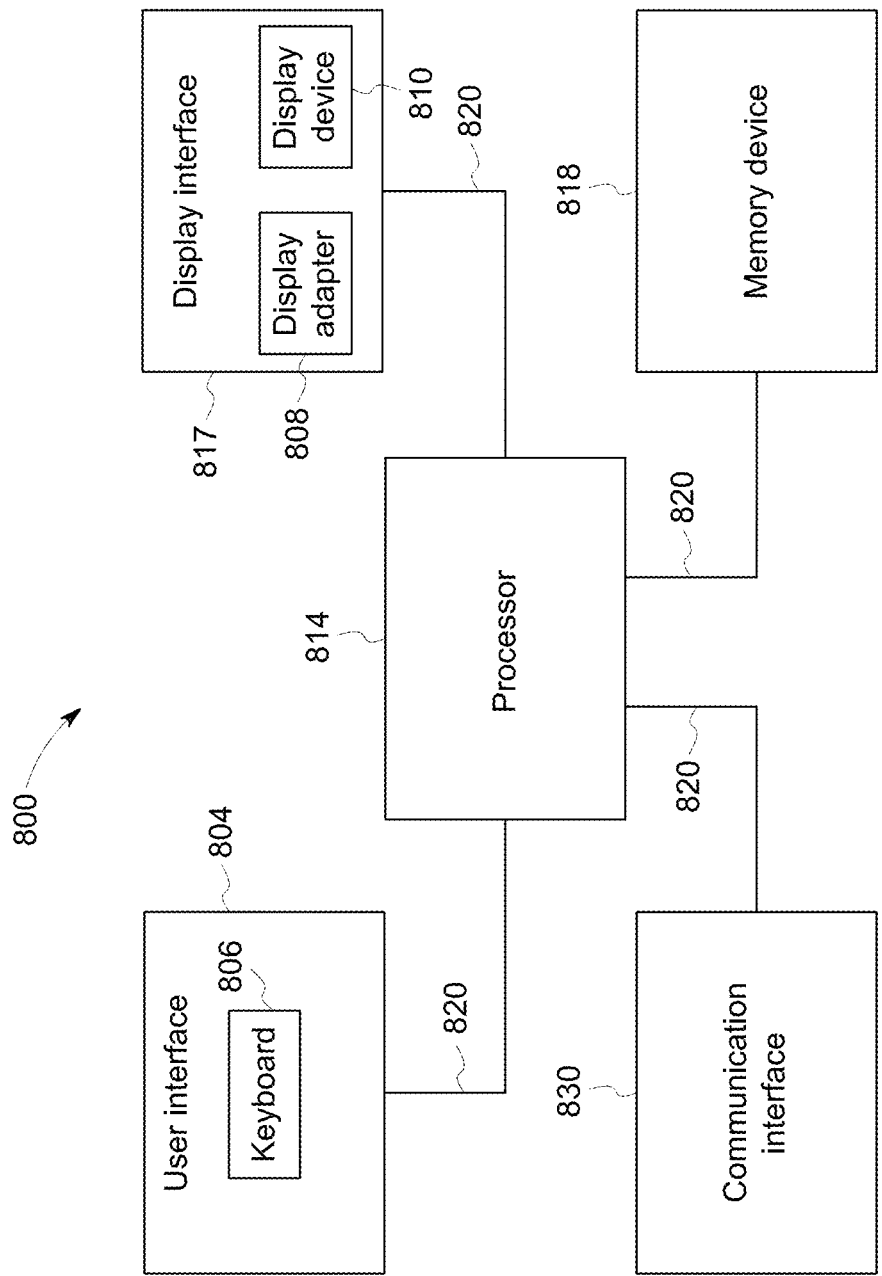

FIG. 9 is a block diagram of an exemplary computing device.

DETAILED DESCRIPTION

The disclosure includes systems and methods of motion correction of magnetic resonance (MR) images acquired by a PROPELLER (Periodically Rotated Overlapping ParallEL Lines with Enhanced Reconstruction) technique of a subject. As used herein, motion correction or correcting motion of an image is transforming the image back to a state where motion does not occur, or reducing or removing artifacts caused by motion. A subject is a human, an animal, or a phantom. Motion correction for slices of images acquired by 2D PROPELLER is described herein as an example only. The systems and methods disclosed herein may be applied to motion correction of images acquired by PROPELLER in 3D, such as images acquired by PROPELLER in a plurality of slice-encoding steps. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
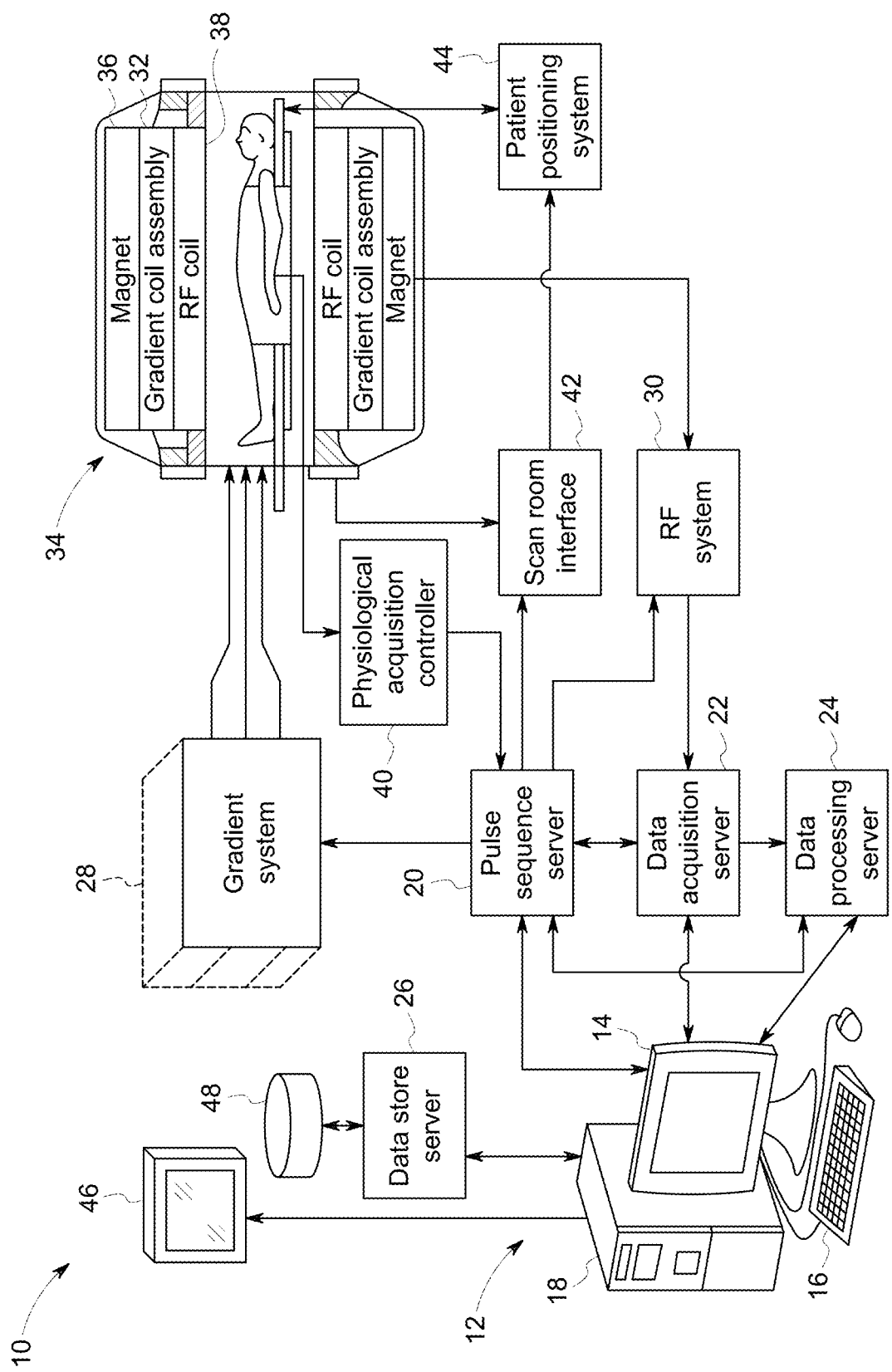
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for frequency encoding, phase encoding, and slice selection/encoding of MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M=\sqrt{I^2+Q^2} \qquad (1);$$

and the phase of the received MR signal may also be determined as in Eq. (2) below:

$$\varphi = \tan^{-1}\left(\frac{Q}{I}\right). \qquad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1, from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

The systems and methods disclosed herein are used to reduce or remove motion artifacts in images acquired by PROPELLER. Compared to other imaging modalities, MRI is unique in that an MRI signal is represented by a complex number, rather than a scalar or a real number. The image value for each image pixel, therefore, includes a magnitude and a phase. Complex MR images may be reconstructed based on I and Q quadrature MR signals, using processes such as Fourier transform.

Figure 2A:
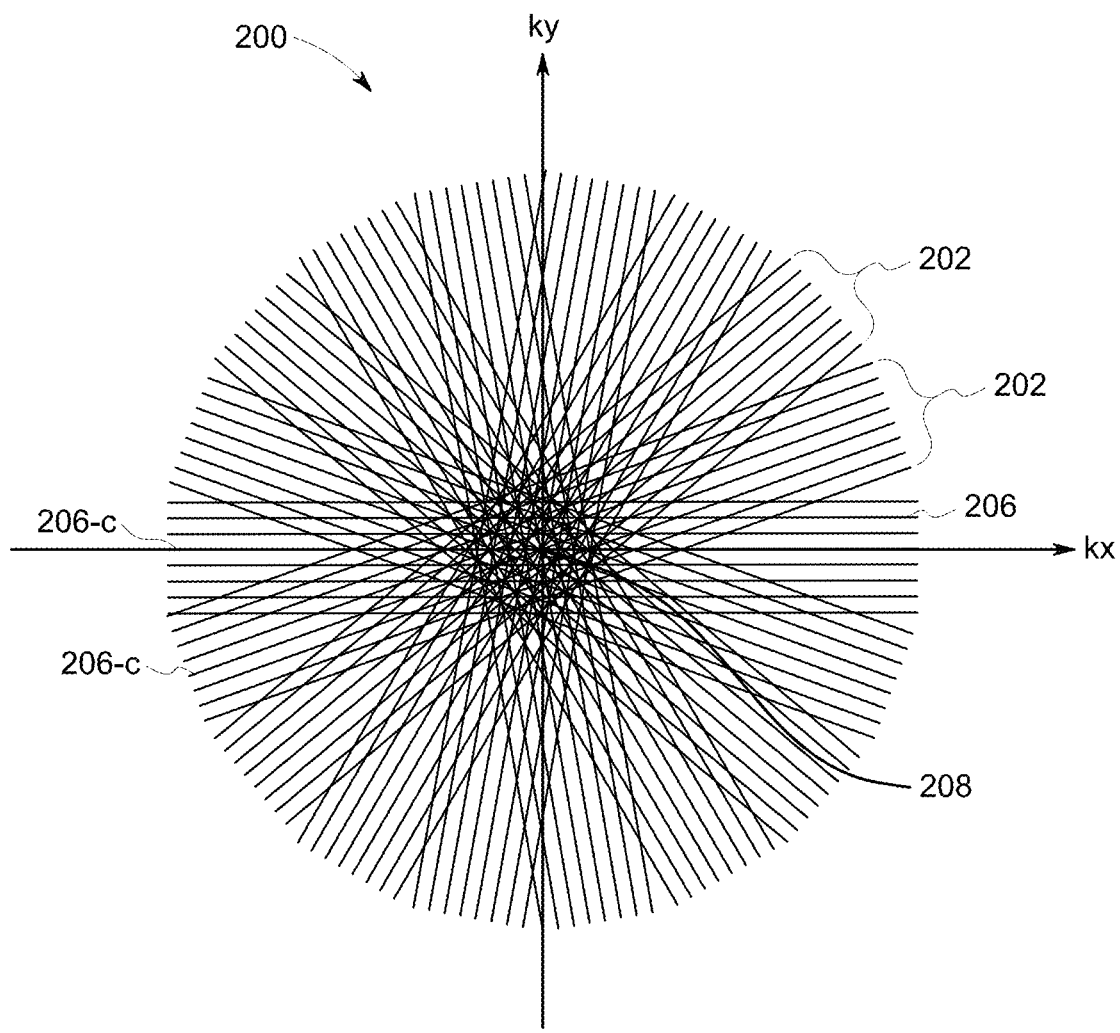
FIG. 2A is a schematic diagram of a k-space trajectory of a PROPELLER (Periodically Rotated Overlapping ParallEL Lines with Enhanced Reconstruction) sampling scheme.
Figure 2B:
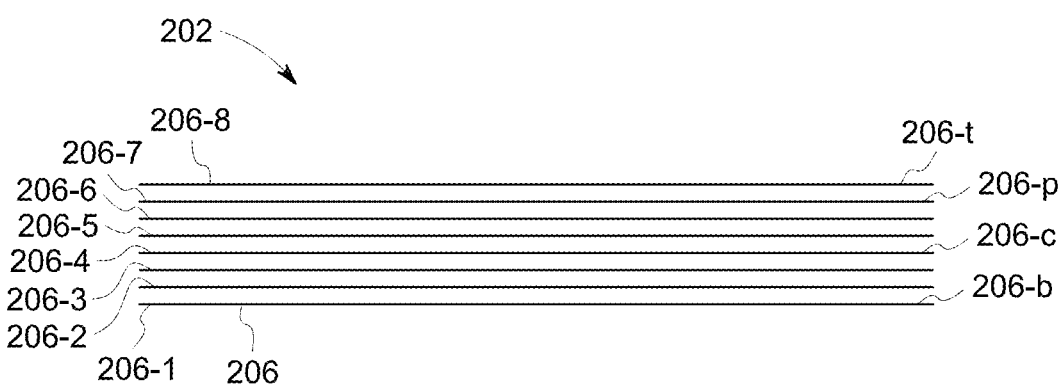
FIG. 2B is schematic diagram of a blade in the sampling scheme shown in FIG. 2A.

FIGS. 2A-2B show a PROPELLER k-space sampling scheme. FIG. 2A is a schematic diagram of a k-space trajectory 200 of a PROPELLER sampling scheme. FIG. 2B shows a blade 202 in the PROPELLER sampling scheme. A PROPELLER sampling scheme is a scheme of sampling the k-space by a PROPELLER pulse sequence, where the k-space is sampled by rotating blades 202 with each blade 202 having a plurality of views 206. An image acquired by PROPELLER may be referred to as a PROPELLER image. In MR, a pulse sequence is a sequence of RF pulses, gradient pulses, and data acquisition applied by the MRI system 10 in acquiring MR signals. As described above, in MRI, the MR signals are acquired by sampling the k-space with gradients Gx, Gy, Gz, which correspond to kx/frequency-encoding direction, ky/phase-encoding direction, and kz/slice-encoding direction. An MR image can be reconstructed from the MR signals using Fourier transform. The k-space is typically sampled along a Cartesian grid, where the k-space sampling points are in a rectilinear pattern. The advantage of Cartesian sampling is that data points are regularly spaced and can be placed directly into standard array processors designed for fast Fourier Transform (FFT) computations. The disadvantage of Cartesian sampling is the Cartesian sampling method's sensitivity to motion.

A PROPELLER pulse sequence does not sample the k-space along the Cartesian grid. Instead, a PROPELLER pulse sequence samples the k-space in a radial pattern, where the k-space lines radially span from the center region of the k-space, and is categorized as a radial sampling scheme. Compared to a standard radial acquisition, which samples one line after an RF excitation pulse, in a PROPELLER sampling scheme, a blade 202 that includes a plurality of views or k-space lines 206 is sampled after an RF excitation pulses through fast spin echo sampling or other manners such as gradient echo. The number of views 206 in one blade 202 typically may be between 16 and 32. The views 206 in a blade 202 are generally parallel to one another, where a center view 206-c of the blade 202 may go through the center 208 of the k-space. After a blade 202 at a certain angle is acquired, the blade 202 rotates by an angle at which time second, third, and so on sets of data are acquired. This process continues until MR data from the entire k-space circle have been collected.

The major benefit of radial sampling is its relative insensitivity to motion. Unlike Cartesian sampling, radial sampling does not have fixed frequency and phase-encoding directions. Noise from moving anatomic structures does not propagate as discrete ghosts, blurring, or artifacts along a single phase-encoding direction. In radial sampling, such noise is distributed diffusely across the entire image. Further, because the center region of the k-space is oversampled, all radial lines make equal contributions to the image and include signals with a relatively-high intensity from the center region of the k-space, unlike Cartesian sampling, which only samples the center region of k-space over a few lines. As a result, motion during one or a few radial lines has less likelihood to severely degrade image quality. Moreover, in PROPELLER, the center region R is sampled by all blades 202. This redundancy may be used to estimate motion and therefore to correct motion.

Figure 3A:
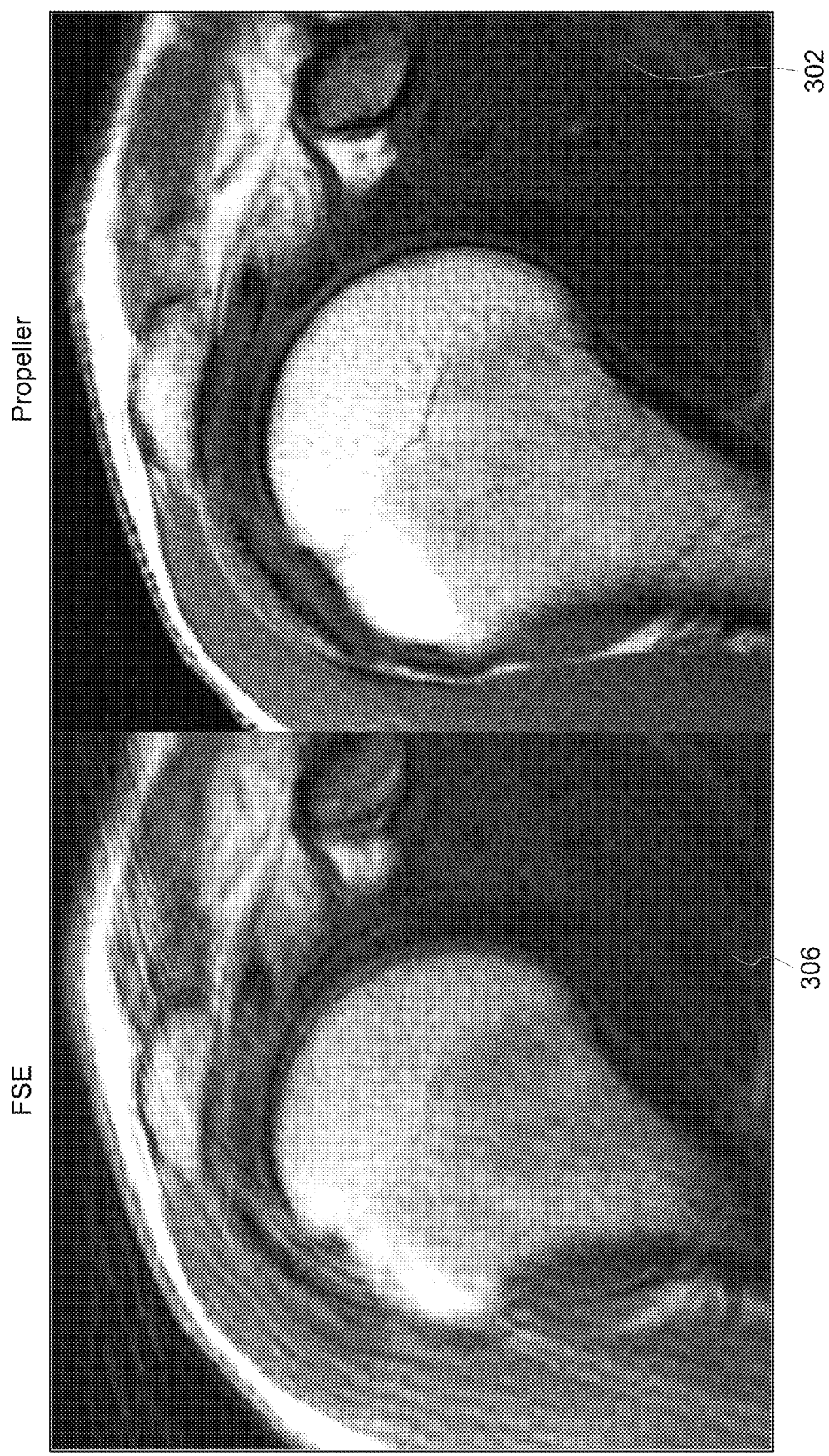
FIG. 3A is a comparison of images acquired by PROPELLER and images acquired by Cartesian fast spin echo.
Figure 3B:
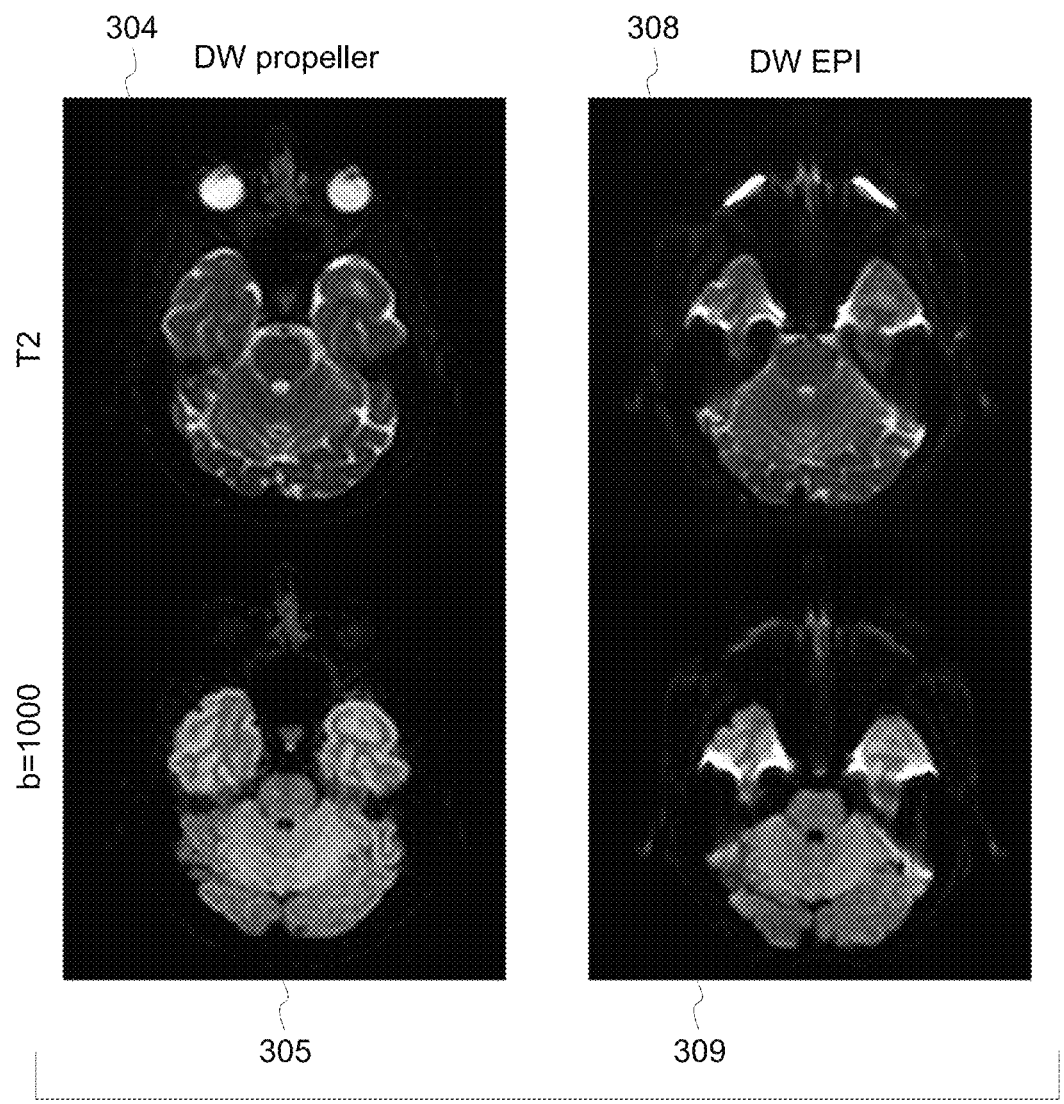
FIG. 3B is a comparison of images acquired by PROPELLER and images acquired by echo planar imaging.

FIGS. 3A and 3B show a contrast of images 302, 304, 305 acquired by PROPELLER with images 306, 308, 309 acquired by Cartesian sampling over the same region of anatomy and with the same matrix size and field of view (FOV). The image 306 was acquired by Cartesian fast spin echo (FSE). The image 308, 309 was acquired by echo planar imaging (EPI). The images 305, 309 are diffusion-weighted images. The PROPELLER image 302 is less blurry and more homogeneous than the FSE image 306. Similarly, the PROPELLER image 304, 305 has less image distortion and is more uniform than the EPI image 308, 309.

FIGS. 4A-4D show a known motion correction method 400 and images without and with motion correction by the method 400. The assumption of the known method 400 is that motion parameters may be estimated from the k-space data. The method 400 includes estimating and correcting 402 rotation of the MR data using magnitude k-space data. The magnitude k-space data $M_n$ at the center region R from each blade 202 (FIG. 2) are gridded onto R and averaged together to form a reference k-space data $M_A$. Each $M_n$ is rotated by a series of angles and gridded onto R for each angle. For each blade 202, the correlation of $M_n$ with $M_A$ is calculated as a function of the rotation angle. The maximum of the calculated correlations is when $M_n$ is rotated to $M_A$. The correlation, as a function of the rotation angle, is fitted to a second-order polynomial function, and the peak of the polynomial function is the estimated angle of rotation for the blade 202. Once the rotation angles for all blades 202 are estimated, coordinates of each blade are rotated by the estimated rotation angle for that blade. That is, the rotation portion of motion correction is completed.

The translation is then estimated and corrected 404 using the complex k-space data $D_n$ at the center region R with the rotation-corrected coordinates. Similar to rotation estimation, complex rotation-corrected k-space data $D_n$ at the center region R for all blades 202 are averaged to derive an averaged complex data $D_A$. In estimating translation, complex conjugate $D_A^*$ of $D_A$ is multiplied by $D_n$, and Fourier transform is applied to the product. Then the peak magnitude of the Fourier transformed product is identified, and a three-point parabolic fit of the magnitude about the peak in the x and y direction is performed. The location of the vertex of this parabola is the estimated translation in the x and y directions, and a corresponding linear phase is removed from the collected data for that blade 202 to correct translation portion of the motion, because translation in the real or image space x-y corresponds to a linear phase change in the k-space kx-ky. At this point, the k-space data are motion corrected or rotation and translation corrected. This motion correction is performed slice by slice. That is, the motion correction only corrects in-plane motion, motion that occurred within the slice.

After the motion correction 400 is performed, correlation thresholding may be performed to discard or apply low weights to k-space data from blades 202 corresponding to significant through-plane motion, uncorrected nonrigid body motion, or other factors that would create artifacts in the final reconstructed images. The final image is reconstructed using the correlation weighted k-space data from blades 202 by gridding the correlation weighted k-space data and applying a Fourier transform.

The method 400 assumes that motion is mostly in-plane rigid motion and that motion can be estimated based on the phase and signal changes of the k-space data. This assumption, however, is not always correct. The method 400 therefore has several drawbacks. Firstly, through-plane motion is not corrected. FIG. 4B shows a coronal image 412 acquired by PROPELLER without using the motion correction method 400 and a coronal image 414 based on the same k-space data but with the motion correction 400. Although the motion corrected image 414 has reduced motion artifacts 416 compared to uncorrected image 412, motion artifacts 416 are still present in the image 414 because the method 400 only corrects in-plane motion artifacts. Secondly, each slice is aligned separately and therefore the slices may be misaligned. FIG. 4C shows axial images 418, 420 of two neighboring slices (i.e., slices next to one another) in the brain and a sagittal image 422 generated based on a series of axial images including the images 418, 420. For images shown in FIG. 4C, a series of axial slices are acquired by a PROPELLER pulse sequence, the axial images are motion corrected by the method 400, and using the axial images, sagittal images are generated show the images from a different orientation. In MR, to minimize cross-talks between slice profiles of neighboring slices of slice-selective RF pulses, even slices and odd slices may be acquired in different passes. The subject may have moved between acquisition of different passes. In the motion correction 400, individual axial images 418, 420 are aligned independently from one another. As a result, the slices are misaligned, which is presented as a zig-zagged pattern 424 along the slice direction 423 in the sagittal image 422.

Thirdly, because rotation is estimated and corrected 402 before estimation and correction 404 of translation in the method 400, the method 400 heavily depends on the robustness in rotation estimation and correction. For edge axial slices of the brain, when the anatomy presents itself as relatively round and symmetrical, rotation estimation fails (FIG. 4D). FIG. 4D shows an axial image 426 based on k-space data acquired by PROPELLER without motion correction 400 and an axial image 428 based on the same acquired k-space data but with the motion correction 400. The motion-corrected image 428 has much lower image quality than the uncorrected image 426. For example, the motion-corrected image 428 has a greatly-increased number of artifacts 416. More importantly, the rotation estimation is so inaccurate that the estimated rotation is not usable. That is, rotation estimation and correction 402 in the method 400 failed for the edge slice.

Fourthly, the method 400 is only effective for brain images and tends to fail when applied to PROPELLER images of other anatomies in the body because the method 400 does not correct through-plane motion and other anatomies in the body has more through-planes motion from respiratory motion and/or cardiac motion. Finally, the motion correction 400 tends to fail for an imaging volume that is off iso-center (or off-center imaging volume or region) of the magnet 36 (see FIG. 1). The magnetic field of the system 10 at locations away from the iso-center of the magnet 36 is not as uniform as locations near or at the iso-center, and this nonuniformity presents as phase variations in the k-space data. Because motion estimation and correction in the method 400 is based on complex k-space data that includes the phase information, the method 400 tends to fail for off-center anatomies, such as wrists, knees, or shoulder in musculoskeletal (MSK) imaging.

Systems and methods described herein are used to address the problems associated with the method 400. Instead of based on the k-space data, the motion correction systems and methods described herein are based on images to derive motion parameters. The systems and methods described herein correct both in-plane and through-plane motion in the image space, instead of only correcting in-plane motion in the k-space and throwing away k-space data containing through-plane motion and other undesired factors. Through-plane motion may be corrected through slice to volume registration. The systems and methods described herein are robust and broaden the application of motion correction of PROPELLER images to the edge slices of the brain, to other anatomies in the body besides the brain, to off-center imaging volumes, and to diffusion-weighted imaging.

FIG. 5A is a schematic diagram of an exemplary motion correction system 500. In the exemplary embodiment, the system 500 includes a motion correction computing device 502 configured to correct motion of MR images. The motion correction computing device 502 may be included in the workstation 12 of the MRI system 10, or may be included in a separate computing device that is in communication with the workstation 12, through wired or wireless communication. In some embodiments, the motion correction computing device 502 is a separate computing device from the workstation 12 and receives MR images acquired by the workstation 12 through a portable storage device, such as a flash drive or a thumb drive.

FIG. 5B is a flow chart of an exemplary method 550 of correcting motion in images acquired by a PROPELLER pulse sequence. The method 550 may be implemented on the motion correction computing device 502. The method 550 includes receiving 552 k-space data of a three-dimensional (3D) imaging volume of the subject, the k-space data of the 3D imaging volume correspond to precorrection MR images and were acquired by an MR system by rotating a blade in the k-space, each blade including a plurality of views. The k-space data may be acquired by a PROPELLER sequence in slices or in a two-dimensional (2D) manner, where the 3D imaging volume includes a plurality of slices, a slice is selected by a z gradient, and the kx-ky plane corresponding to that slice is sampled in a PROPELLER manner, i.e., by rotating a blade in the kx-ky plane of that slice. Alternatively, the k-space data may be acquired by a PROPELLER sequence in a plurality of slice-encoding steps or in a 3D manner. For example, the 3D k space (kx-ky-kz) is sampled by stacks of blade sampling of kx-ky planes along the kz direction. kz corresponds to a slice encoding step. That is, the k-space data are acquired by rotating a blade in a kx-ky plane corresponding to a slice-encoding step. Final images are derived by applying a Fourier transform in the kz dimension, as well as in the kx and ky dimensions. The 3D k-space data may be Fourier transformed in the kz direction to derive k-space data of a plurality of slices, which are processed similarly to k-spaced data acquired in a 2D manner.

In the exemplary embodiment, the method 550 also includes receiving 554 a 3D MR calibration data of a 3D calibration volume. The calibration data is obtained in a separate acquisition. For example, a calibration scan is typically used in MR scans for calculating coil sensitivity maps of multi-coils and other scan parameters. Therefore, the systems and methods described herein do not require extra scanning or increase the total scan time. The calibration data may be k-space data, images, or a combination thereof. The 3D imaging volume is equal to or smaller than the 3D calibration volume. Further, the method 550 includes jointly estimating rotation and translation based on the k-space data of the 3D imaging volume and the calibration data. Unlike the method 400, where rotation is estimated and corrected before translation is estimated and corrected, in the exemplary embodiment, rotation and translation are jointly estimated in the same operation, and are jointly corrected in the same operation. The method 550 also includes 558 correcting motion in the precorrection images based on the estimated rotation and the estimated translation. Moreover, the method 550 includes outputting 560 the motion-corrected image.

FIG. 6 is a flow chart of an exemplary embodiment of jointly estimating 556 rotation and translation. k-space data acquired in slices are used as an example for illustration only. The systems and methods may be applied to k-space data acquired in a plurality of slice-encoding steps. In the exemplary embodiment, for each slice in the plurality of slices, rotation and translation are jointly 602 estimated for each blade in the slice. The estimation is performed in the image space. In some embodiments, rotation and translation are estimated by image registration. For example, to estimate motion in an image I, a function of the differences between a transformed image of the image I and a target image/a template image is optimized, with motion parameters such as rotation and translation as the optimizing variables. The transformed image is the image I being transformed with motion parameters, such as rotation and translation. In PROPELLER, the k-space data in the center region R are sampled by all blades 202 (see FIG. 2). The center region R is within a circle having L/FOV in diameter, where L is the number views 206 in one blade 202. For each blade, the k-space data in the center region R may be referred to as center k-space data of the blade and be denoted as $S_n$. A center image of a blade may be reconstructed based on the center k-space data of the blade $S_n$. A center image as used herein refers to an image reconstructed from the center k-space data, either for a blade 202 when using the center k-space data $S_n$ of the blade 202 or for the slice when using the center k-space data of all blades 202 in that slice. In one example, the center k-space data of the blade is gridded onto a Cartesian grid and then a Fourier transform is performed on the gridded center k-space data of the blade to derive the center image of the blade. In estimating blade rotation and blade translation, a template image is a center image of the slice, which is reconstructed based on the center k-space data of the slice. In one example, the center k-space data of the slice is derived by gridding the center k-space data of each blade $S_n$ to a Cartesian grid, combining the gridded centered k-spaced data of the blades in the slice, and averaging the combined k-space data over the number of blades 202. The center k-space image of the slice is reconstructed using methods such as performing a Fourier transform on the center k-space data of the slice. As a result, blade rotation and blade translation of each blade are estimated based on the center image of the blade and the center image of the slice.

In the exemplary embodiment, the translation for each blade is then fine-tuned 604 because in jointly estimating 602 rotation and translation, the translation is estimated based on low resolution images reconstructed from the center k-space data $S_n$ of the blade and the center k-space data of the slice, and was limited by interpolation methods. In fine-tuning 604, the translation is also estimated by optimizing a difference function between a transformed image and a template image. Different from jointly estimating 602, in fine-tuning 604, the optimization is repeated and during each repetition, the template image is updated with estimated translation from the previous iteration, i.e., the template image is translation corrected with the translation estimated in the previous iteration. As such, the estimated translation has an increased accuracy than that estimated without fine-tuning 604.

In the exemplary embodiment, once the rotation and translation are estimated for all blades 202, the k-space data is motion corrected. For example, for each blade, the coordinates of the k-space data of that blade are rotated with the estimated blade rotation and a linear phase proportional to the estimated blade translation is removed from the k-space data of that blade. In some embodiments, fine-tuning 604 may be skipped, where motion correction uses rotation and translation estimated in jointly estimating 602. The motion corrected k-space data at the center region R for blades in a slice are combined 606 to reconstruct a low-resolution center image of the slice. In some embodiments, the k-space data is not motion corrected and the center k-space data $S_n$ are combined 606 to derive a low-resolution center image of the slice. Jointly estimating 602 and fine-tuning 604 is repeated first for all blades in a slice and then for all slices in the 3D imaging volume. Combining 606 is repeated for all slices in the 3D imaging volume. As a result, a plurality of center images of the 3D image volume are derived.

In the depicted embodiment, the calibration data may be volume reformatted 608. If the calibration data are k-space data or a mixture of k-space data with images, the calibration data or k-space data of the calibration data are reconstructed into images of a plurality of slices in the 3D calibration volume, The 3D calibration volume may be greater than the 3D imaging volume, or the calibration scan may have different slice numbers and orientations. The calibration data is resliced and reoriented such that the slices in the 3D calibration volume match the slices in the 3D imaging volume. That is, each slice in the 3D calibration volume and its corresponding slice in the 3D imaging volume are of the same anatomical location. Reformatting 608 may be skipped if the 3D calibration volume and 3D imaging volume are the same and the slices in the calibration and imaging volumes already match. Contrast normalization 610 may be performed on the reformatted 3D calibration data. Because the calibration data are acquired with different pulse sequences, matrix sizes, resolutions, and scan parameters from the k-space data of the 3D imaging volume, the contrast of the calibration data may be different from the images acquired by a PROPELLER sequence. Contrast normalization 610 is used to transform the calibration images to have the same or similar contrast as the images in the 3D imaging volume. In some embodiments, the contrast of images of the 3D imaging volume acquired by the PROPELLER sequence is also normalized and contrast of the normalized calibration images and contrast of the normalized images in the 3D imaging volume are the same or similar.

In the exemplary embodiment, slice rotation and slice translation are jointly estimated 612 based on the reformatted and/or normalized calibration images and the center images of the slices derived after combining 606 the center k-space data of the blades. In some embodiments, the contrast in images of the 3D imaging volume is also normalized, and jointly estimating 612 is based on the reformatted and/or normalized calibration images and normalized center images of the slices. Calibration data are acquired much faster than PROPELLER k-space data. For example, for the same 3D volume, calibration data take approximately 2-6 seconds, while PROPELLER k-space data take minutes. As a result, calibration data contain much less motion than PROPELLER k-space data and can serve as a much better reference in motion estimation than center images, thereby increasing the accuracy of motion estimation. Further, because slices in PROPELLER k-space data are registered to a common reference of calibration data, motion estimation is consistent from slice to slice, compared to the method 400. Slice rotation and slice translation of a slice may be estimated by registering the center image of the slice to the calibration image of the corresponding slice through optimization of a function of the differences between a transformed image of the center image of the slice and the calibration image of the slice, using the calibration image of the slice as the template image. Slice rotation and slice translation are estimated 612 slice by slice. That is, jointly estimating 612 slice rotation and slice translation is repeated for the plurality of slices in the 3D imaging volume. In some embodiments, translation is fine-tuned 614. Similar to fine-tuning 604 blade translation, fine-tuning 614 slice translation is performed iteratively. The optimization process in estimating slice translation is repeated with the template image is updated with translation corrected template image based on translation estimated in the previous iteration. Because the resolution of the center image is based only the center k-space data, the resolution of the center image is low. Fine-tuning 614 slice translation improves the estimation accuracy of slice translation. In some embodiments, fine-tuning 614 slice translation is skipped. In some embodiments, through-plane motion may be estimated by registering slices in the 3D imaging volume to the 3D calibration volume. The estimated through-plane motion may be combined with blade rotation and translation and slice rotation and translation to correct motion in the PROPELLER images.

In the exemplary embodiment, blade rotation and translation and slice rotation and translation are combined 616 to derive the final blade rotation and final blade translation for each blade in the 3D imaging volume. For example, final rotation is the sum of blade rotation and slice rotation, and final translation is computed as: final translation=blade translation*exp(i*(slice rotation))+slice translation.

In the exemplary embodiment, once the final blade rotation and final blade translation are estimated, motion is corrected 558 using the estimated final blade rotation and final blade translation. For example, the k-space data for each blade 202 is rotation-corrected with the estimated final blade rotation, where the k-space coordinates (kx, ky) are multiplied by a rotation matrix $$R(\theta) = \begin{bmatrix} \cos\theta & -\sin\theta \\ \sin\theta & \cos\theta \end{bmatrix},$$

where θ is the rotation. The k-space data for each blade 202 is also translation-correction with the estimated final blade translation, where a linear phase proportional to the translation is removed from the k-space data of the blade. Different from the motion correction in combining 606 center k-space data, in motion correction 558, the correction is performed on the entire blade or the entire k-space data of the blade. Because the final blade rotation and translation correspond to each blade in each slice, each slice is motion-corrected independently, thereby allowing fast reconstruction using parallel processing, where images or k-space data of slices or slice-encoding directions are split into two or more passes, which are processed separately and in parallel with one another.

FIG. 7 is a comparison of images 702, 704 motion-corrected by the known method 400 and image 706, 708 motion-corrected by the methods and systems described herein. The images 702, 706 are coronal images based on slices of axial images. The images 704, 708 are sagittal images based on slices of axial images. The images 702-708 are based on the same k-space data. Compared to the images 702, 704 motion-corrected with the known method 400, the zig-zagged patterns 424 are greatly reduced in the images 706, 708 motion-corrected with the methods and systems described herein. That is, the slices are aligned with one another in the method 550.

FIG. 8 is a further comparison of images 801, 803 motion-corrected by the known method 400 and image 805, 807 motion-corrected by the method 550. The images 801, 805 are axial images of a slice close to the top of the head, and are acquired with a PROPELLER pulse sequence and with views 206 in each blade 202 acquired sequentially. The image 801 has much more discernible crosshatching and ripple artifacts than the image 805 and is not as sharp as the image 805. The images 803, 807 are images of a motion phantom, and are acquired using a PROPELLER pulse sequence and with views 206 in each blade 202 acquired in a center-out manner. The image quality of the image 803 is deteriorated to the point that the image 803 is unusable, indicating the known method 400 failed in motion correction.

Referring back to FIG. 2, each blade 202 includes a plurality of views 206. In acquiring the blade 202, the views 206 may be acquired sequentially, where the views are acquired in order, either starting from the bottom view 206-b and going up or starting from the top view 206-t and going down. The views 206 may be acquired in a center-out manner, where the views are acquired starting from a center view 206-c, which is a view crossing the center 208 of the k-space or view(s) having a relatively shorter distance to the center 208 than other views 206, and moving outwards. As used herein, a distance from a point (e.g., the center 208) to a line (e.g., a view 206) is the perpendicular distance of the point to the line. Views 206 that are farther out from the center 208 may be referred to as peripheral views 206-p. For example, if a blade 202 includes eight views as 206-1 to 206-8 with 206-4 as the center view 206-c. In a center-out manner, 206-4 is acquired first, then 206-5 or 206-3, 206-6 or 206-2, 206-7 or 206-1, and then 206-8. Because the center view 206-c is closer to the center 208 of the k-space, the signal intensity of the center view 206-c is higher than that of peripheral views 206-p. Because signal-to-noise ratio (SNR) in diffusion weighted imaging (DWI) is low especially for high b-values, to maximize the signal acquired by DWI using DW PROPELLER, for each blade 202, views are acquired in a center-out manner, taking advantage that center views 206-c have higher signal intensity then peripheral views 206-p. However, peripheral views 206-p are at k-space locations with at higher spatial frequencies and have more detailed information of spatial locations than the center views 206-c. Signals from peripheral views 206-p are therefore needed for motion correction. As a result, the increased SNR sacrifices signals from k-space locations with higher spatial frequencies. Because the known method 400 uses k-space data to estimate motion, the method 400 heavily depends on signal modulation of the k-space data, and fails in estimating motion due to the reduced signals from higher spatial frequencies in a center-out acquisition. In contrast, the systems and methods described herein are image-based motion estimation, break the assumption that signal fluctuation in the k-space data comes only from in-plane motion, and instead use image structures to estimate the motion parameters based on the calibration data as a common reference. As a result, the systems and methods herein are robust in motion correction.

Referring back to FIG. 8, image quality of the image 803, which is motion-corrected by the known method 400, is much worse than that of the image 807, which is motioned corrected by the method 550. Image quality of the image 803 is even worse than an image without motion correction (not shown). Therefore, the known motion-correction method 400 typically is not performed in DWI PROPELLER. In contrast, the method 550 works for sequential or center-out views (see images 803, 807). The method 550, therefore, may be used for motion correction of DWI PROPELLER images. In correcting motion in DW images, the motion correction is performed for each diffusion-weighting direction and on images without diffusion weighting (T2 images) separately. For example, if DW images in x-, y-, and z-diffusion directions and a T2 image for each slice are acquired, the method 550 is performed for x-, y-, and z-diffusion directions and the T2 images separately before the images from different diffusion directions are combined and before the DW images and the T2 images are used to further process and analysis such as computation of apparent diffusion coefficient (ADC) map. This is, the method 550 is repeated for each diffusion direction and for the T2 images. If a plurality of b-values are used in diffusion weighting, the method 550 may be repeated for each b-value.

The workstation 12 and the motion correction computing device 502 described herein may be any suitable computing device 800 and software implemented therein. FIG. 9 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) motion correction for PROPELLER images of increased accuracy; (b) robust motion correction for all slices or slice-encoding steps and for anatomies besides the brain; (c) image-based motion correction; (d) jointly estimating rotation and translation; (e) fine-tuning estimation of translation; (0 motion correction suitable for diffusion weighted PROPELLER; (g) consistent alignment across slices after motion correction without penalty of increase in scan time by aligning to calibration data; and (h) independent motion-correction for each slice, thereby allowing fast reconstruction using parallel processing.

Exemplary embodiments of systems and methods of motion correction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging method of correcting motion in precorrection MR images of a subject, comprising:
   applying, by an MR system, a pulse sequence having a k-space trajectory of a blade being rotated in k-space, the blade including a plurality of views;
   acquiring k-space data of a three-dimensional (3D) imaging volume of the subject, the k-space data of the 3D imaging volume corresponding to the precorrection MR images and acquired by the pulse sequence;
   receiving a 3D MR calibration data of a 3D calibration volume, wherein the 3D calibration volume is greater than or equal to the 3D imaging volume;
   jointly estimating rotation and translation in the precorrection MR images based on the k-space data of the 3D imaging volume and the calibration data;
   correcting motion in the precorrection images based on the estimated rotation and the estimated translation; and
   outputting the motion-corrected images.

2. A motion correction system of correcting motion in precorrection magnetic resonance (MR) images of a subject, comprising a motion correction computing device, the motion correction computing device comprising at least one processor in communication with at least one memory device, and the at least one processor programmed to:
   receive k-space data of a three-dimensional (3D) imaging volume of the subject, the k-space data of the 3D imaging volume corresponding to the precorrection MR images and acquired by a pulse sequence having a k-space trajectory of a blade being rotated in k-space, the blade including a plurality of views;
   receive a 3D MR calibration data of a 3D calibration volume, wherein the 3D calibration volume is greater than or equal to the 3D imaging volume;
   jointly estimate rotation and translation in the precorrection MR images based on the k-space data of the 3D imaging volume and the calibration data;
   correct motion in the precorrection images based on the estimated rotation and the estimated translation; and
   output the motion-corrected images.

3. The method of claim 1, wherein jointly estimating rotation and translation further comprises:
   reformatting slices in the 3D calibration volume to match slices in the 3D imaging volume; and
   jointly estimating the rotation and the translation based on the k-space data of the 3D imaging volume and the reformatted calibration data.

4. The method of claim 1, wherein jointly estimating rotation and translation further comprises:
   normalizing contrast in images of the calibration data; and
   jointly estimating the rotation and the translation based on the k-space data of the 3D imaging volume and the normalized calibration data.

5. The method of claim 1, wherein jointly estimating rotation and translation further comprises:
   jointly estimating blade rotation and blade translation in each blade based on the k-space data of the 3D imaging volume.

6. The method of claim 5, wherein jointly estimating rotation and translation further comprises:
   iteratively fine-tuning the blade translation.

7. The method of claim 1, wherein:
   acquiring k-space data further comprises acquiring k-space data of a plurality of slices in the 3D imaging volume, and wherein for each slice in the plurality of the slices, the k-space data of the 3D imaging volume were acquired by rotating a blade in a kx-ky plane corresponding to the slice; and
   jointly estimating rotation and translation further comprises:
      for each slice in the 3D imaging volume,
         combining k-space data in a center region of the blades of the slice into center k-space data of the slice; and
         reconstructing a center image of the slice based on the center k-space data of the slice; and
      jointly estimating slice rotation and slice translation based on center images of the plurality of slices and the calibration data.

8. The method of claim 7, wherein jointly estimating rotation and translation further comprises:
   for each slice in the 3D imaging volume,
      for each blade in the slice,
         reconstructing a center image of the blade using center k-space data of the blade;
         jointly estimating blade rotation and blade translation based on the center image of the blade and the center image of the slice; and
         motion-correcting the k-space data of the blade using the blade rotation and the blade translation; and
      updating the center image of the slice based on the motion-corrected k-space data of the blades in the slice; and
   jointly estimating slice rotation and slice translation based on the updated center images of the plurality of slices and the calibration data.

9. The method of claim 1, wherein:
   jointly estimating rotation and translation further comprises:
      jointly estimating blade rotation and blade translation in each blade based on the k-space data of the 3D imaging volume;
      jointly estimating slice rotation and slice translation in each slice in the 3D imaging volume based on the k-space data of the 3D imaging volume and the calibration data; and
      computing final blade rotation and final blade translation based on the estimated blade rotation, the estimated blade translation, the estimated slice rotation, and the estimated slice translation; and
   correcting motion in the precorrection images further comprises correcting motion in the precorrection images using the final blade rotation and the final blade translation.

10. The method of claim 1, wherein acquiring k-space data further comprises acquiring k-space data of the 3D imaging volume in a plurality of slice-encoding steps, for each slice-encoding step in the plurality of the slice-encoding steps, the k-space data of the 3D imaging volume were acquired by rotating a blade in a kx-ky plane corresponding to the slice-encoding step.

11. The method of claim 1, wherein acquiring k-space data further comprises acquiring k-space data of the 3D imaging volume along a plurality of diffusion directions; and the method further comprises:
   for each diffusion-weighting direction,
      jointly estimating rotation and translation based on k-space data of the 3D imaging volume of the diffusion-weighting direction and the calibration data;

correcting the motion in precorrection images of the diffusion-weighting direction based on the estimated rotation and the estimated translation; and outputting the motion-corrected images of the diffusion-weighting direction.

12. The method of claim 11, wherein acquiring k-space data further comprises:

acquiring the k-space data of the 3D imaging volume, wherein the k-space data of the 3D imaging volume were acquired by acquiring views in the blade in a center-out manner.

13. The method of claim 11, wherein acquiring k-space data further comprises:

acquiring the k-space data of the 3D imaging volume, the k-space data of the 3D imaging volume were acquired by acquiring views in the blade in a sequential manner.

14. The method of claim 1, wherein acquiring k-space data further comprises:

acquiring the k-space data of the 3D imaging volume, the 3D imaging volume is off from an iso-center of the MR system.

15. The method of claim 1, wherein jointly estimating rotation and translation further comprises jointly estimating rotation and translation in the precorrection MR images based on images derived from the k-space data of the 3D imaging volume and images derived from the calibration data.

16. The system of claim 2, wherein the at least one processor is further programmed to:

jointly estimate blade rotation and blade translation in each blade based on the k-space data of the 3D imaging volume; and iteratively fine-tune the blade translation.

17. The system of claim 2, wherein:

the at least one processor is further programmed to acquire k-space data of a plurality of slices in the 3D imaging volume, wherein for each slice in the plurality of the slices, the k-space data of the 3D imaging volume were acquired by rotating the blade in a kx-ky plane corresponding to the slice; and for each slice in the 3D imaging volume, the at least one processor is further programmed to:

combine k-space data in a center region of the blades of the slice into center k-space data of the slice; and reconstruct a center image of the slice based on the center k-space data of the slice; and the at least one processor is further programmed to jointly estimate slice rotation and slice translation based on center images of the plurality of slices and the calibration data.

18. The system of claim 17, wherein the at least one processor is further programmed to:

for each slice in the 3D imaging volume, for each blade in the slice, reconstruct a center image of the blade using center k-space data of the blade;

jointly estimate blade rotation and blade translation based on the center image of the blade and the center image of the slice; and motion-correct the k-space data of the blade using the blade rotation and the blade translation; and update the center image of the slice based on the motion-corrected k-space data of the blades in the slice; and jointly estimate slice rotation and slice translation based on the updated center images of the plurality of slices and the calibration data.

19. The system of claim 2, wherein the at least one processor is further programmed to:

jointly estimate blade rotation and blade translation in each blade based on the k-space data of the 3D imaging volume;

jointly estimate slice rotation and slice translation in each slice in the 3D imaging volume based on the k-space data of the 3D imaging volume and the calibration data;

compute final blade rotation and final blade translation based on the estimated blade rotation, the estimated blade translation, the estimated slice rotation, and the estimated slice translation; and correct motion in the precorrection images using the final blade rotation and the final blade translation.

20. The system of claim 2, wherein the at least one processor is further programmed to:

receive k-space data of the 3D imaging volume along a plurality of diffusion directions, wherein the k-space data of the 3D imaging volume were acquired by acquiring views in the blade in a center-out manner; and for each diffusion-weighting direction, jointly estimate rotation and translation based on the k-space data of the 3D imaging volume of the diffusion-weighting direction and the calibration data;

correct the motion in precorrection images of the diffusion-weighting direction based on the estimated rotation and the estimated translation; and output the motion-corrected image of the diffusion-weighting direction.

* * * * *